United States Patent [19]

Tanaka

[11] 4,187,469

[45] Feb. 5, 1980

[54] LIMITED CHANNEL TELEVISION RECEIVER WITH ORGANIZED MEMORY

[75] Inventor: Akio Tanaka, Chicago, Ill.

[73] Assignee: Zenith Radio Corporation, Glenview, Ill.

[21] Appl. No.: 840,340

[22] Filed: Oct. 7, 1977

[51] Int. Cl.$^2$ ............................................. H04B 1/16
[52] U.S. Cl. ..................................... 325/464; 325/459
[58] Field of Search ............... 325/464, 465, 468, 470, 325/453, 459; 358/191, 193; 334/11, 14, 15

[56] References Cited

U.S. PATENT DOCUMENTS 3,979,680  9/1976  Sakamoto .............................. 325/464

Primary Examiner—Robert L. Griffin
Assistant Examiner—Alexander Gerasimow

[57] ABSTRACT

A two-mode limited channel television receiver includes a memory address counter for scanning the locations of a limited position memory in response to generation of a channel number by a channel number counter. Channel numbers and corresponding tuning information may be programmed into and deleted from the limited location only memory. In the programmed channel mode, memory locations with programmed channel numbers are accessed in channel number order. In the skipped channel mode, only unprogrammed channel numbers are produced and displayed to the viewer. In a variation, all channel numbers, both programmed and unprogrammed are produced and displayed. Empty memory locations are automatically accessed when an unprogrammed channel number is generated.

15 Claims, 5 Drawing Figures

LIMITED CHANNEL TELEVISION RECEIVER WITH ORGANIZED MEMORY

CROSS REFERENCE TO RELATED PATENT APPLICATION

This application is related to but not dependent upon copending application Ser. No. 840,341 filed Oct. 7, 1977.

BACKGROUND OF THE INVENTION

This invention relates generally to digitally tuned television receivers and specifically to such receivers that incorporate tuning memories for a limited number of channels. The invention deals specifically with memory organization in receivers that are user programmable to receive desired channels at a limited number of tuning positions.

The prior art includes a variety of all-channel television receivers having a limited number of tuning positions, which are usually vertically oriented adjacent to the picture tube. Each position may be programmed to receive any of the 82 FCC allocated television channels by accessing the various positions and tuning in a desired channel at each position. Translucent channel number identification tabs, corresponding to the number of the tuned channel, are generally inserted adjacent to the tuning position. The receiver may be thereafter tuned either remotely or via an up/down switch with the position and channel member selected being set apart by being illuminated, for example. Some receivers incorporate push buttons at each tuning position and direct tuning to a programmed channel may be accomplished by pushing the appropriate button.

Each of these systems incorporates a memory having fewer locations than there are FCC allocated television channels. This represents a practical solution since only a very few of the 82 allocated channels are available in any given geographical area. To provide memory for every channel would not only prove cumbersome, but economically wasteful, since memory costs are a function of memory size or capacity and system complexity is related to the number of tuning positions. The larger the memory, whether in terms of number of words (locations) or length of words (bits), the greater the cost.

Most prior art systems incorporate memories in the form of potentiometers. There are also systems which use digital to analog converters for storing tuning voltage words, sometimes of considerable length. One proposed limited channel system is designed to store 14 bits of tuning information for each of 16 tuning positions. Some of the less obvious drawbacks of limited channel receivers are the difficulties presented to the user. Specifically, the viewer must often perform complicated programming operations and remember the programmed channels and their sequence.

With the invention, the viewer need not "keep track of" programmed channels or their sequence. It is done automatically. As will be seen, the viewer is also not normally aware of the fact that he has only a limited channel television receiver since he is not confronted with the channel position display, whether vertically oriented or in the form of a rotatable drum. Ease of programming and viewer operation are greatly enhanced. With prior art limited channel systems all programmed numbers or positions are visible in the sense that a multiple location display panel area or a rotatable drum is provided. In the inventive system, a display area need be provided for a single two digit channel number only, thus not only simplifying the system, enabling a larger more legible channel number readout, but also allowing a great deal of styling freedom to the designer.

The system has a programmed channel and a skipped channel mode. In the programmed channel mode, each entered channel number is automatically searched for among the limited locations of the memory and the system only stops at programmed channels. For these channels, tuning information exists in the tuning memory at a channel number identifiable address. Whenever that channel number is selected, the memory contents are read out for tuning the receiver to the "memorized" channel. Many advantages over prior art systems obtain with the memory organizing system of the invention. For example, the desired channels are read out in sequence without duplication. A viewer thus need not remember in what order the channels have been programmed not whether the channel has been programmed. The system automatically reads the programmed channels out in sequential order. If the desired channel number does not appear in this mode, that indicates to the viewer that the channel has not been programmed.

In the skipped channel mode, only unprogrammed channel numbers stop the system. The system reaches an unused memory location, if available. If no unused memory locations are available, the system will so indicate to the viewer. Thus should it be desired to program in a channel, the viewer need merely generate that channel number in the skipped channel mode which automatically accesses one of the unused memory locations. Should all memory locations be filled, the viewer is given a visual indication that further channels cannot be programmed in without removing a previously programmed channel. Thus the viewer needn't remember which channels have been programmed.

OBJECTS OF THE INVENTION

The principal object of the invention is to provide a novel limited channel all-electronic television receiver tuning system.

Another object of this invention is to provide an improved all-electronic limited channel television receiver tuning system having all-channel capability.

SUMMARY OF THE INVENTION

In accordance with the invention, a television receiver tuning system includes a limited-location channel number memory means for storing channel number-related tuning information for desired television channels, sequence means, address means addressing the memory locations under control of the sequence means, and interrogator means accessing the locations of said memory means based upon the stored contents therein.

BRIEF DESCRIPTION OF THE DRAWINGS

Other objects and advantages of the invention will become apparent by reading the description in conjunction with the drawings, in which.

DESCRIPTION OF THE PREFERRED EMBODIMENT

Figure 1:
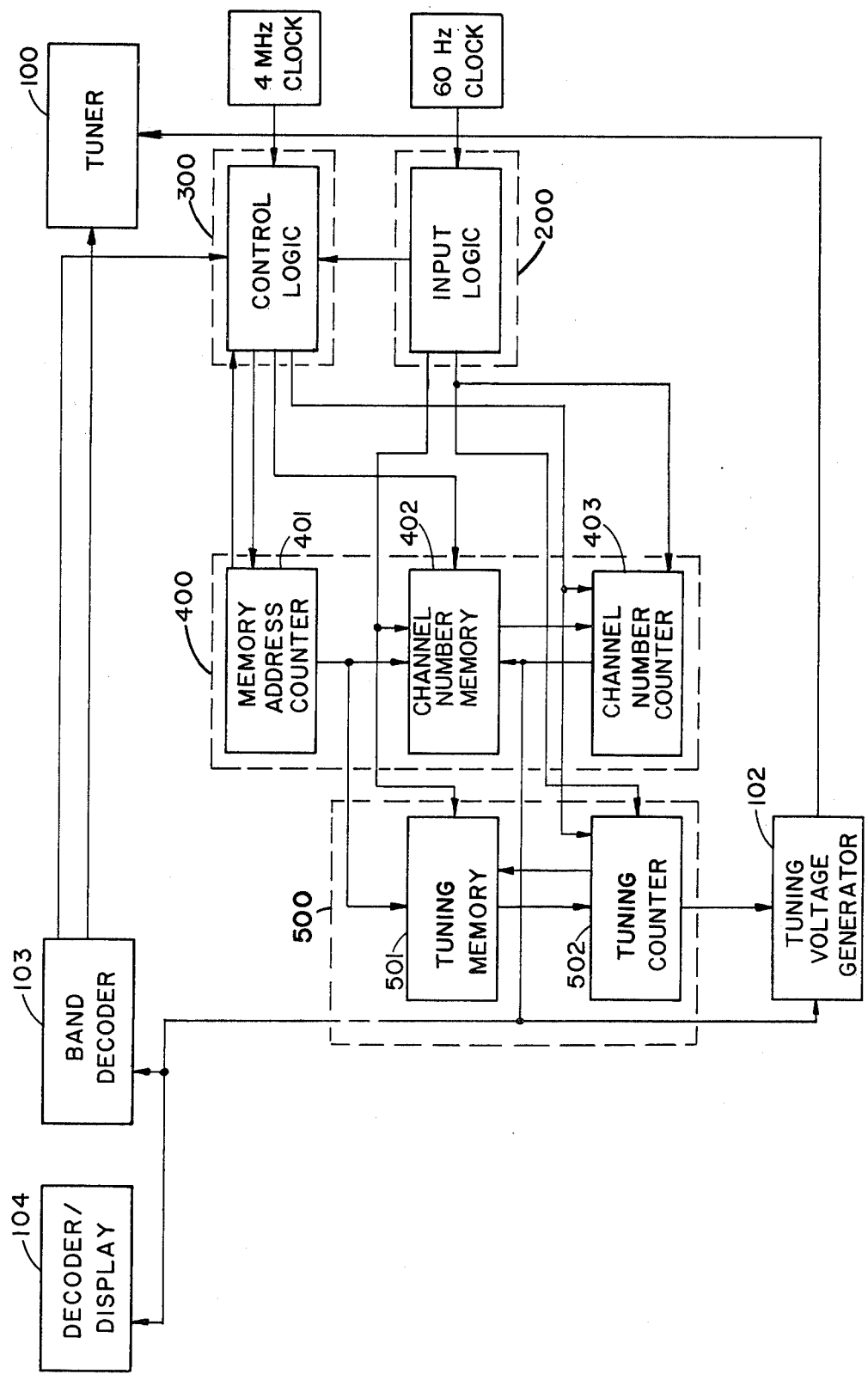
FIG. 1 is a block diagram of a television receiver tuning system constructed in accordance with the present invention.

Referring to the block diagram of FIG. 1, a tuner 100 is driven from a tuning voltage generator 102. Tuning voltage generator 102 may comprise any of a well-known number of television tuning systems which produce a potential for tuning to a selected television channel frequency in response to an appropriate control signal corresponding to that channel frequency. A band decoder 103 supplies tuner 100 with appropriate frequency band switching information based upon the selected channel number and also supplies a control logic circuit 300. A decoder/display 104 yields a visual indication of the selected channel number to the viewer. Both the band decoder and the decoder/display are conventional.

A 4 MHz clock source drives control logic 300 and a 60 Hz clock source drives an input logic circuit 200. The channel number apparatus 400 is indicated by the dashed line block and includes a memory address counter 401 addressing a channel number memory 402 and a channel number counter 403 functionally intercoupled with the memory. Control logic 300 is connected to channel number memory 402 and is intercoupled with memory address counter 401. A tuning apparatus, included in dashed line block 500, includes a tuning memory 501 connected to memory address counter 401, and is functionally intercoupled with tuning counter 502. Channel number counter 403 is coupled to input logic 200 and control logic 300 and supplies tuning voltage generator 102, band decoder 103 and decoder/display 104 with channel number information. Control logic 300 and input logic 200 are coupled together and both supply tuning counter 502. The input logic is coupled to both the channel number and tuning memories. The tuning counter supplies tuning information to tuning voltage generator 102.

INPUT LOGIC 200 (FIG. 2)

Input logic 200 contains the operating switches and electronics for the various counters and memories in the system. A clock pulse source 201 is supplied with a 60 Hz input and produces an approximate 2 Hz output and non-overlapping two phase 15 Hz outputs. These signals are supplied to one input of a plurality of OR gates 228-230 comprising a state decoder 235. The output of OR 228 carries the tuning clock signal, the output of 229 the tuning write (TW) signal and the output of OR 230 carries the channel clock signal.

The outputs of state decoder 235 are also supplied to a NAND gate 236 which drives a flip flop (FF) 203 for controlling operation of clock pulse source 201. NAND 236 and FF 203 assure that the clock pulse source outputs are maintained until completion of a cycle. A conventional deglitch circuit 202 supplies the preset input of FF 203 and is in turn supplied from the 60 Hz source.

Figure 3:
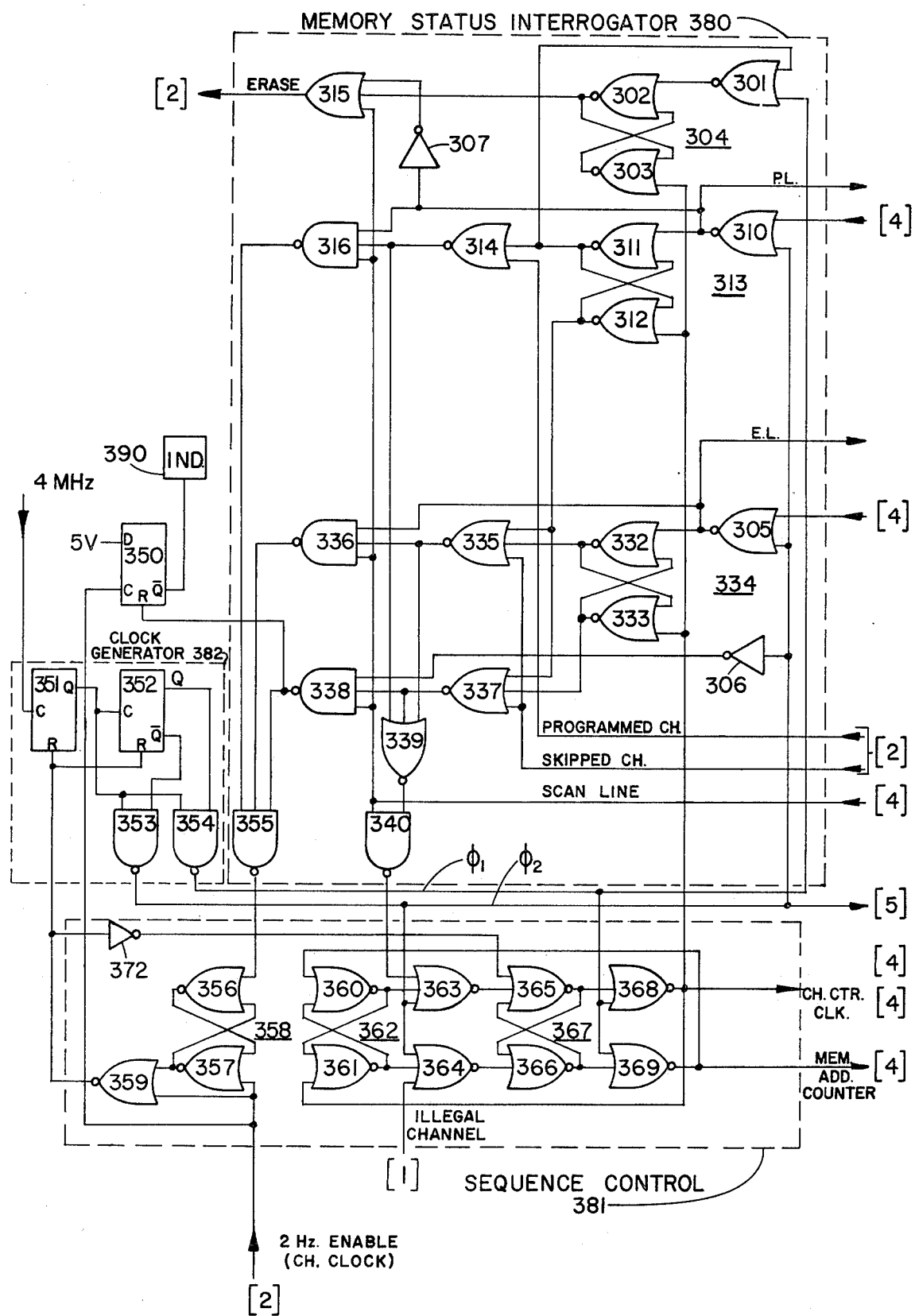
FIG. 3 is a schematic diagram of control logic circuit 300 of FIG. 1.

AND gate 204 and a plurality of NAND gates 205-210 and 215-219 have their inputs connected to a group of momentary-contact, single-pole, double-throw switches 221, 223, 224 and 225. Switch 221 constitutes a skip/stop switch and, depending upon which of its two poles is grounded, results in either a skip or stop signal, along with a simultaneous write signal being sent to the memories. The tuning write and an erase signal from FIG. 3 are coupled to the inputs of AND 204. AND 204 produces the write signal responsive to grounding of either pole of switch 221. Inverted PL and EL signals are supplied from the control logic to NAND's 206 and 205, respectively. NANDS 205 and 206 are cross-coupled to form an RS FF 207, the output of which produces the skip/stop signal. Each of the remaining switches 223-225 supplies a multiple input NAND 208 which provides an initiate signal to commence a system cycle. The output of NAND 208 is connected to the input of deglitch circuit 202 which guards against the system confusing momentary electrical disturbances as switch closures.

NAND's 209 and 210 are cross-coupled to form an RS FF 211 which produces an up/down signal U/D responsive to closure of any of switches 223-225. A switch 224, labelled programmed, and a switch 225, labelled skipped, in a channel counter control 240 are arranged with respect to an RS FF 220 (comprising cross-coupled NAND's 218 and 219) to produce appropriate signals on the skipped line and programmed line. An RS FF 217 comprising cross-coupled NAND's 215 and 216 produce appropriate signals on the tuning line and channel counter line in response to operation of the tuning switch 223 or the channel counter control, respectively. The outputs of RS FF 217 are connected to the inputs of NOR's 228-230 in state decoder 235 and in conjunction with the outputs of clock pulse source 201 produce appropriate clock and write signals for the system.

The outputs of RS FF 220 are supplied to the control logic and determine its operational sequence. An auxiliary switch 250 is provided in series with the skipped line. Thus the skipped line may either be grounded or connected to the output of NAND 218 depending upon the particular type of operation desired.

When switch 225 is closed, the system steps among all unprogrammed channel numbers in channel number sequence, in the direction determined by the grounded pole. With auxiliary switch 250 grounding the skipped line, operation of switch 225 results in the channel number counter sequencing through all channel numbers, both programmed and unprogrammed (skipped), in numerical order. With auxiliary switch 250 connected as indicated, operation of switch 225 results in the channel counters sequencing through only the skipped channel numbers. The auxiliary switch arrangement provides a degree of flexibility for the viewer heretofore unobtainable. Operation of switch 224 results in sequencing through all programmed or "saved" channel numbers for normal viewing. The channel numbers may be conveniently transferred from one category to the other as will be seen.

CONTROL LOGIC 300 (FIG. 3)

The control logic includes three groups of gates, the first arranged as a memory status interrogator, the second as a sequence control and the third as a clock generator. The memory status interrogator is generally designated by a dashed line block 380, the sequence control by a dashed line block 381 and the clock generator by a dashed line block 382. The system has two different operating modes, one of which is sequencing through programmed or "saved" channel numbers and the other being sequencing through only skipped channels. An all-channel number variation in the latter mode allows sequencing through both programmed and skipped channel numbers.

Briefly in sequencing with the skipped switch in the all-channel number variation, the channel number memory is interrogated by the memory address counter to determine if that channel number is included among those programmed or "saved". The memory address counter scans twice through the channel number memory locations. On the first scan, the presence or absence of the channel number is determined and whether there are any unused memory locations. On the second scan, the memory address counter is stopped at the appropriate channel number memory location if the number is programmed and the corresponding tuning adjustment information in the accessed tuning memory is supplied through the tuning counter to the tuning voltage generator. If the channel number is not among those that have been programmed the memory address counter stops at an unused memory location on the second scan, if available.

Appropriate memory status indications are given to the viewer. For example, if a channel number is not saved, a signal to that effect is given so that it may be programmed if desired. It it is not saved and there are no available memory locations, a different signal is given to inform the viewer. During the first scan, any duplicate stored channel numbers that may exist are automatically erased. If the skipped channel switch system is used in the unmodified condition, i.e. with switch 250 ungrounded, the system is sequenced as before except that system operation terminates for non-programmed channel numbers.

If the programmed channel switch in the channel counter control is operated (normal operating mode of receiver) the channel number generator counter is clocked and memory interrogation occurs for the new number (as described above). If the new channel number is not in the memory, a clocking signal is developed at the beginning of the second scan to increment the channel number counters one count. This process continues until the next "saved" channel number is encountered, whereupon a stop signal is produced on the second scan.

Figure 4:
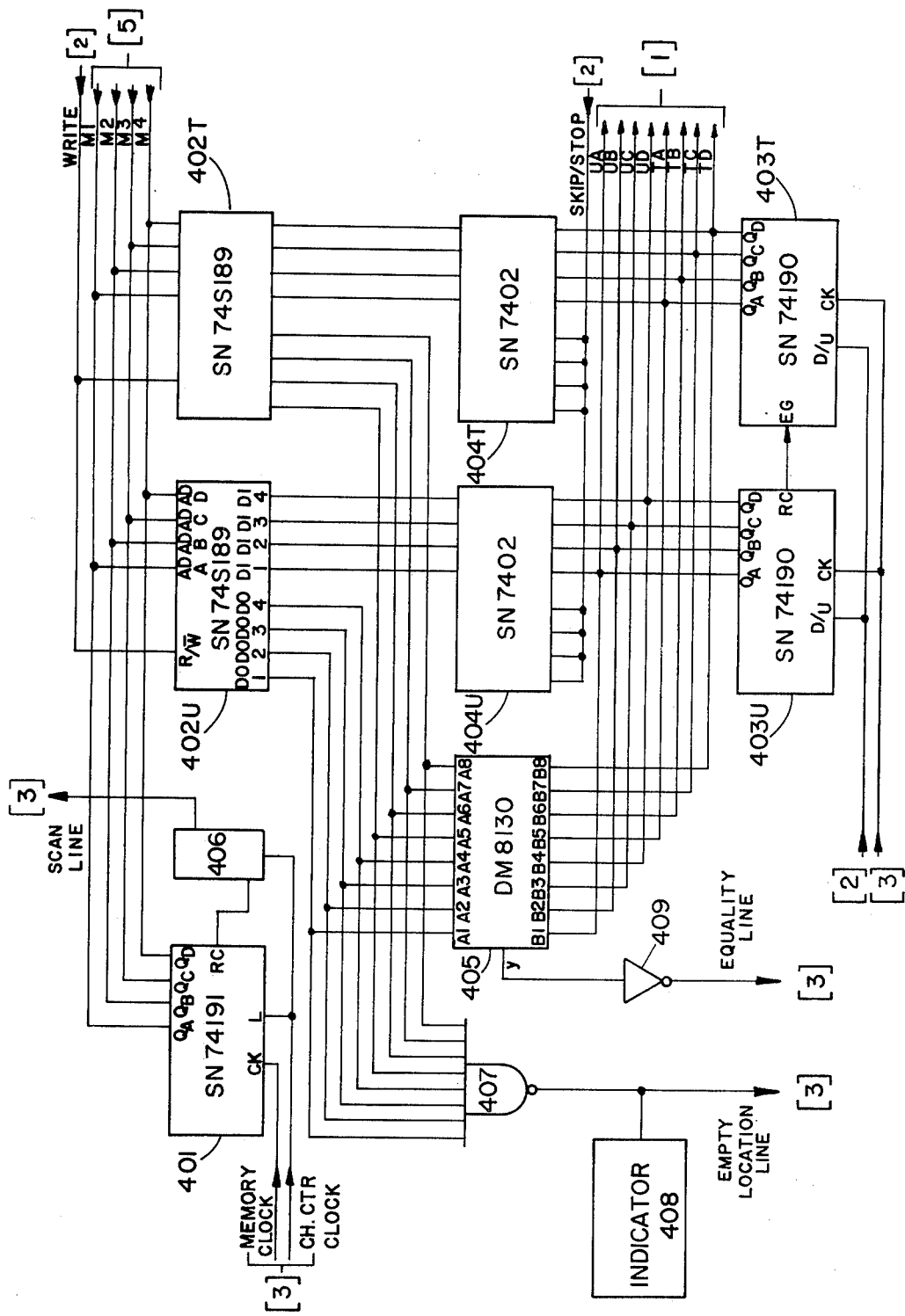
FIG. 4 is a schematic diagram of channel number apparatus 400 of FIG. 1.

A 4 MHz clock signal is supplied to the clock terminal of a FF 351 having its Q output terminal coupled to the clock terminal of a FF 352. FF's 351 and 352 and NAND's 353 and 354 comprise clock generator 382. The Q terminal of FF 351 is connected to one input each of NAND's 353 and 354, their other inputs being connected to the $\overline{Q}$ and Q terminals, respectively, of FF 352. The output of NAND 354 carries the $\phi_1$ signal and the output of NAND 353 carries the $\phi_2$ signal. $\phi_1$ and $\phi_2$ are nonoverlapping two phase 1 MHz pulse trains. $\phi_1$ is supplied to one input of a pair of NOR's 368 and 369 in sequence control 381 and to an input of a NOR 301 in the erase logic of memory status interrogator 380. $\phi_2$ is supplied to one input each of a pair of NOR's 363 and 364 in the sequence control. In the memory status interrogator it is supplied to an inverter 306, to one input of a NOR 305 in the empty memory location logic and to one input of a NOR 310 in the channel number equality logic. A NOR 359, which controls operation of clock generator 382, is connected to the reset terminals of FF's 351 and 352 and to a first input of a NOR 365 through an inverter 372. NOR 365 and a NOR 366 are cross-coupled to form an RS FF 367 having its output terminals supplying the remaining inputs of NOR's 368 and 369. The output of NOR 368 provides a channel counter clock signal for the channel number counter (FIG. 4). NOR 368 is also connected to an input of NOR 361 in the sequence control and to one input each of NOR's 303, 312 and 333 in the memory status interrogator. The output of NOR 369 provides a clocking signal for the memory address counter (FIG. 4) and is also supplied to an input of a NOR 360, which is cross-coupled with NOR 361 to form an RS FF 362. The respective outputs of RS FF 362 are supplied to a second input each of NOR's 363 and 364. The last input of NOR 363 is supplied from the output of a sequence control continue NAND 340 in the memory status interrogator. NAND 340 interrogates a continue NOR 339 during the second scan which decodes the outputs of a programmed channel NOR 314, a skipped channel NOR 335 and an overflow NOR 337 and supplies a signal to step the channel counters to a new number when required. The last input of NOR 364 is supplied with a signal from the band decoder (FIG. 1) to preclude the channel counter stopping on an "illegal" channel number.

NOR's 356 and 357 are cross-coupled to form an RS FF 358, the output of which is coupled to a first input of NOR 359. The 2 Hz enable signal from NOR 230 in the input logic state decoder (FIG. 2) is coupled to the remaining inputs of NOR's 357 and 359 and to the clock terminal of a FF 350. The remaining input of NOR 356 is supplied from the output of a stop NAND 355 which provides a signal for terminating operation of sequence control 381. The D terminal of FF 350 is supplied from a 5 V d.c. source and its $\overline{Q}$ output drives an indicator device 390.

SEQUENCE CONTROL 381 OPERATION

NOR's 360-369 function as a flip flop for enabling the first $\phi_1$ pulse to step the channel number counter in both the programmed and skipped channel modes. Subsequent $\phi_1$ pulses are used to step the memory address counter. The $\phi_2$ pulses are phase delayed with respect to the $\phi_1$ pulses and are used to interrogate the channel number memory after each step to a new location. The $\phi_2$ pulses are inhibited by the illegal channel number signal, thus enabling the channel number counter to step to another channel number. The $\phi_1$ and $\phi_2$ pulses are negative going.

Assume the output of NOR 359 goes high which enables clock generator 382 and RS FF 367. Initially the output of NOR 365 is low and that of NOR 366 high. (NOR 368 is thus enabled and NOR 369 disabled.) Therefore the first $\phi_1$ pulse from NAND 354 drives the output of NOR 368 high which steps the channel number counter (FIG. 4) in the direction determined by the U/D signal. It also operates RS FF 362 to drive the output of NOR 361 low and that of NOR 360 high. The illegal channel lead output to NOR 364 is normally low. If an illegal channel number is produced, one input to NOR 364 is high. Since one input of NOR 363 is also high (due to RS FF 362) both NOR's are inhibited. Consequently the $\phi_2$ pulse is ineffective, RS FF 367 is not switched to enable subsequent $\phi_1$ pulses to step the memory address counter and therefore the next $\phi_1$ pulse steps the channel counter again.

If the generated channel number is not an illegal one, the band decoder input to NOR 364 will remain low. Since the output of NOR 361 is also low, NOR 364 is enabled. Upon occurrence of the low level $\phi_2$ pulse, the output of NOR 364 goes high which switches RS FF 367 such that the output of 365 is high and that of 366 is low. Thus NOR 369 is enabled for clocking the memory address counter upon occurrence of subsequent $\phi_1$ pulses.

When the output of NOR 369 goes high (responsive to $\phi_1$) it resets RS FF 362 to make the output of 361 high and that of 360 low, thus enabling NOR 363 and inhibiting NOR 364. However, the output of NAND 340 is normally high and the output of NOR 363 remains low. Further $\phi_1$ pulses are effective to drive the output of NOR 369 high and clock the memory address counter. As will be seen, the $\phi_2$ pulses are used to interrogate the status of the memory comparators and clock the tuning counter.

Operation continues as above with the output of NAND 340 being high. If its output goes low, responsive to operation of continue NOR 339, all inputs to NOR 363 are low when $\phi_2$ occurs and RS FF 367 is switched to enable NOR 368 to clock the channel counter again.

MEMORY STATUS INTERROGATOR 380 (FIG. 3)

The remaining input of NOR 310 is supplied with an equality signal (FIG. 4) whenever a programmed channel number in the memory corresponds to the number from the channel number counter. The equality signal constitutes a low logic level voltage, a high logic level indicating non-equality. The output (PL) of NOR 310 is supplied to the skip/stop logic in FIG. 2 and to a first input of a NOR 311, a first input of a NAND 316 and to an inverter 307. The remaining input of NOR 305 is supplied with a signal indicating that the channel number memory (FIG. 4) has an unused location. The output (EL) of NOR 305 is supplied to the skip/stop logic in FIG. 2 and to a first input of a NOR 332 and to a first input of a NAND 336. The inverted $\phi_2$ pulse at the output of inverter 306 is supplied to a first input of a NAND 338.

NOR's 311 and 312 are cross-coupled to form an RS FF 313 having the output of NOR 311 connected to a first input of a NOR 314 and to the remaining input of NOR 301. The output of NOR 312 in RS FF 313 is connected to a first input each of NOR's 335 and 337. The second input of NOR 314 is supplied with the programmed channel signal from the input logic (FIG. 2) whenever the channel counter control is operated to sequence through the programmed channel numbers.

The output of NOR 301 supplies a first input of a NOR 302. NOR's 302 and 303 are cross-coupled to form an RS FF 304, the output of which is supplied to a first input of an OR 315 which produces an erase signal for the channel number memory.

In the empty memory location logic, NOR 332 is cross-coupled with a NOR 333 to form an RS FF 334 having respective outputs supplying a second input of NOR's 335 and 337. The remaining inputs of NOR's 335 and 337 are supplied with the skipped channel signal from the input logic in FIG. 2 when the channel counter control is operated to sequence through the skipped or non-programmed channels. When a low level signal is present, the system operates to stop at all skipped channel numbers only. When both the programmed and skipped channel signals are low, the system is conditioned to stop at all channel numbers, both skipped and programmed. (This is because programmed channels NOR 314 is also enabled in all-channel variation.) The output of the skipped channels decoder NOR 335 is connected to the second input of NAND 336 and to a first input of continue sequence decoder NOR 339. The output of NOR 337 is supplied to a second input of NAND 338 and a second input of NOR 339.

Programmed channels NOR 314 is connected to a second input of NAND 316 and the last input of NOR 339. Inverter 307 is connected to the second input of erase OR 315. The output of NOR 339 is connected to a first input of NAND 340. The remaining inputs of OR 315 and NAND's 316, 336, 338 and 340 are supplied with the scan signal which is low for the first scan and high for the second. The scan signal enables OR 315 on the first scan of the channel number memory and enables NAND's 316, 336, 338 and 340 on the second scan of the memory. The outputs of NAND's 316, 336 and 338 are connected to a stop NAND 355. NAND 338 also supplies the reset terminal of FF 350.

MEMORY STATUS INTERROGATOR 380 OPERATION

When a channel change is initiated, the output of NOR 368 goes high and resets RS FF's 304, 313 and 334 such that the output of NOR's 302, 311 and 332 are all high. Assume that operation has been selected for sequencing through programmed channels. The programmed channel line is low and programmed channels NOR 314 enabled. The skipped channel line is high disabling skipped channels NOR 335 and overflow NOR 337. The memory address counter is stepped in response to the $\phi_1$ pulses and assume further that a memory location bearing the new channel number is found. The equality line goes low and when the next $\phi_2$ pulse occurs, the output of NOR 310 goes high, setting RS FF 313 with the output of NOR 311 being low and that of NOR 312 being high. NOR 314 goes high and simultaneously enables NAND 316 and inhibits continue sequence control NOR 339.

During the first scan, the scan line is low and NAND's 316, 336, 338 and 340 are disabled whereas OR 315 is enabled. During the second scan, the scan line goes high with the opposite effect. In the second scan, when the memory address counter interrogates a memory location with the proper stored channel number, NOR 310 again produces a high output which, when applied to the input of NAND 316, forces its output low. This activates stop NAND 355 causing RS FF 358 to reset and prevent further operation of clock generator 382. If no equality signal occurs all inputs to continue NOR 339 are low, enabling NAND 340 which during the second scan reinitiates sequence control 381. Operation continues until a programmed channel number is encountered.

Automatic erasure of duplicate stored channel numbers is also accomplished. During the first scan the first equality indication results in the output of NOR 311 going low. The next $\phi_1$ pulse forces the remaining input of NOR 301 low, and its output goes high, setting RS FF 304 such that the output of NOR 302 is low. Another input of OR 315 is low during the first scan because the scan line is low. Thus during the first scan two of the three inputs to OR 315 are low and OR 315 is fully enabled. A subsequent finding of equality again drives the output of NOR 310 high and through inverter 307 forces the remaining input of OR 315 low. Thus the output of OR 315 will go low producing an erase signal for erasing the second equality in the memory. Any further findings of equality in the memory channel locations will automatically be erased in the same manner.

When the receiver is being operated in the skipped channel mode, NOR's 335 and 337 are enabled by the low logic level on the skipped channel line and NOR 314 is disabled by the high logic level of the programmed channel line. RS FF's 304 and 313 operate as discussed above. Operation proceeds normally with the 2 Hz enable signal being applied to sequence control 381 and clock generator 382. If an empty number location is encountered in the channel number memory, a low logic level signal is developed on the empty location line which is connected to NOR 305. NOR 305 is enabled by the $\phi_2$ pulse and produces a high logic level pulse EL at its output causing RS FF 334 to be set and drive the output of NOR 332 low and the output of NOR 333 high. If the equality line is low, indicating that the channel number is in the memory, NOR 312 in RS FF 313 inhibits NOR's 335 and 337 by placing a high level signal on their inputs. If the equality line remains high, NOR 312 remains low and NOR's 335 and 337 are enabled. NOR's 335 and 337, in being enabled simultaneously, inhibit continue NOR 339 and enable stop NAND 355. The latter is enabled through decoder NAND's 336 and 338. It will be noted that all the inputs to NAND 336 will be high on the second scan when an unused location is present.

When the channel number memory is full and operation occurs in the skipped channel mode, a special stop signal is needed. The output of NOR 312 is low since the equality line is high, indicating no equality. The output of NOR 333 is also low since there is no empty location in the memory and the skipped channel line is low. Consequently overflow NOR 337 is enabled (during the second scan) producing a high input to continue NAND 339, thus disabling it. The high input is also applied to decoder NAND 338 along with the inverted $\phi_2$ pulse and the high level scan signal causing NAND 338 to operate and forcing stop NAND 355 to terminate operation of the sequence control.

FF 350 controls the memory full indicator 390 as is initially set by the 2 Hz enable signal such that its $\overline{Q}$ is low. When a full memory is indicated by the output of NAND 338 going low, $\overline{Q}$ of FF 350 goes high and turns on indicator 390.

In the all-channel variation of the skipped mode, both the programmed and skipped lines are low thus enabling NOR's 314, 335 and 337 and the system stops for both programmed and skipped channel numbers.

CHANNEL NUMBER APPARATUS 400 (FIG. 4)

This apparatus consists of standard "off-the-shelf" items and bears the commercial part number and terminal designations. The channel number counters 403U and 403T are operated by clocking pulses from the sequence control. A U/D signal is supplied from the input logic in FIG. 2 and the channel counter clock signal is supplied from the sequence control in FIG. 3. The outputs of units counter 403U are coupled to corresponding inputs of a units selective NOR gate 404U and the outputs of tens counter 403T connected to tens selective NOR gates 404T. The outputs of the selective NOR gates are coupled to the $DI_1$–$DI_4$ terminals of a units channel number memory 402U and a tens channel number memory 402T, respectively. The other input terminals of the selective NOR gates are connected together and supplied with the skip/stop signal from NAND 205 in FIG. 2. The channel number counter outputs, respectively labelled UA-UD and TA-TD are supplied to the band decoder, decoder/display and tuning voltage generator in FIG. 1. These outputs also feed the "B" inputs of a comparator 405 whose "A" inputs are supplied from the $DO_1$–$DO_4$ outputs of units memory 402U and tens memory 402T. The Y output of comparator 405 is inverted by an inverter 409 and constitutes the equality line for the memory status interrogator in FIG. 3.

Figure 2:
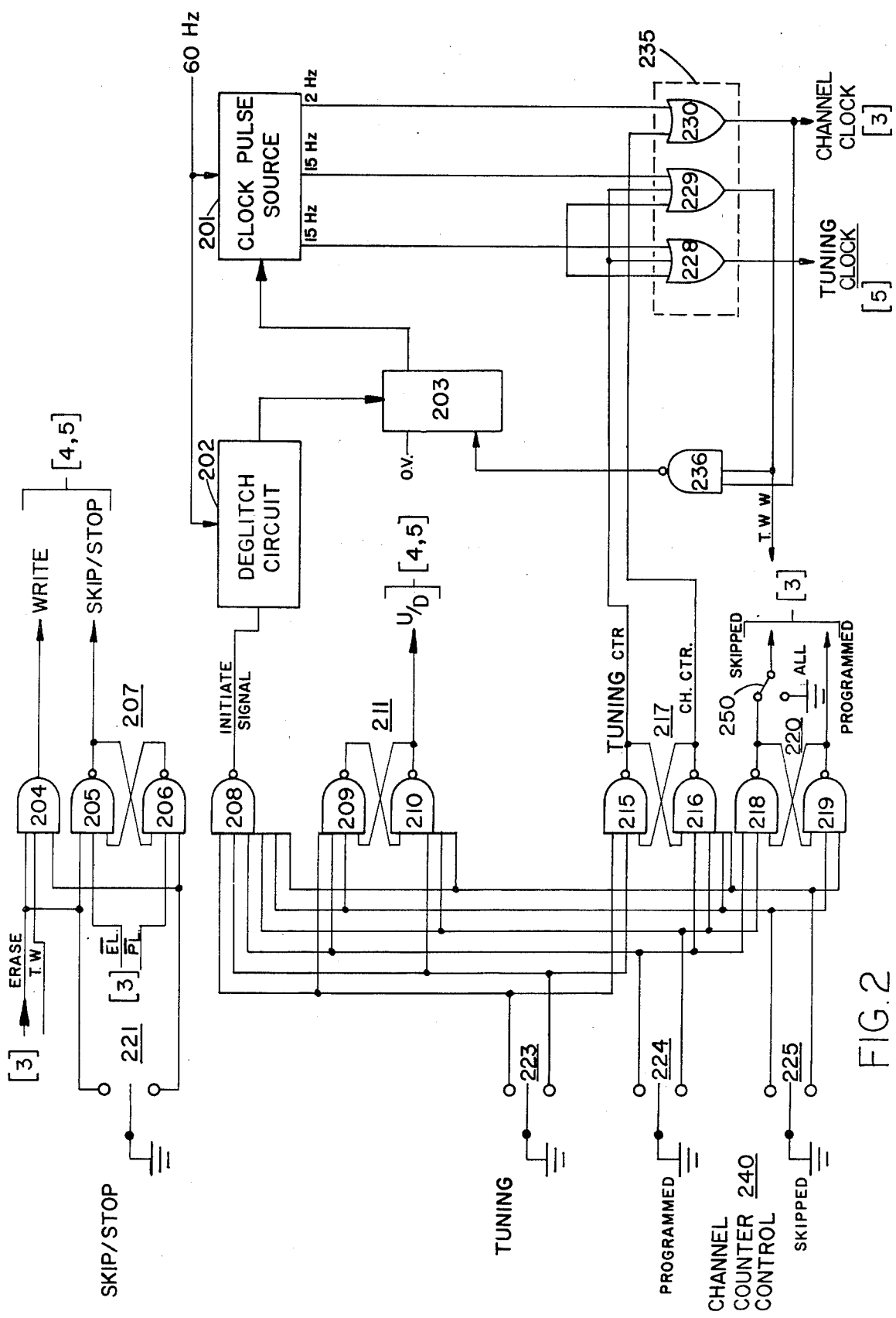
FIG. 2 is a schematic diagram of input logic circuit 200 of FIG. 1.
Figure 5:
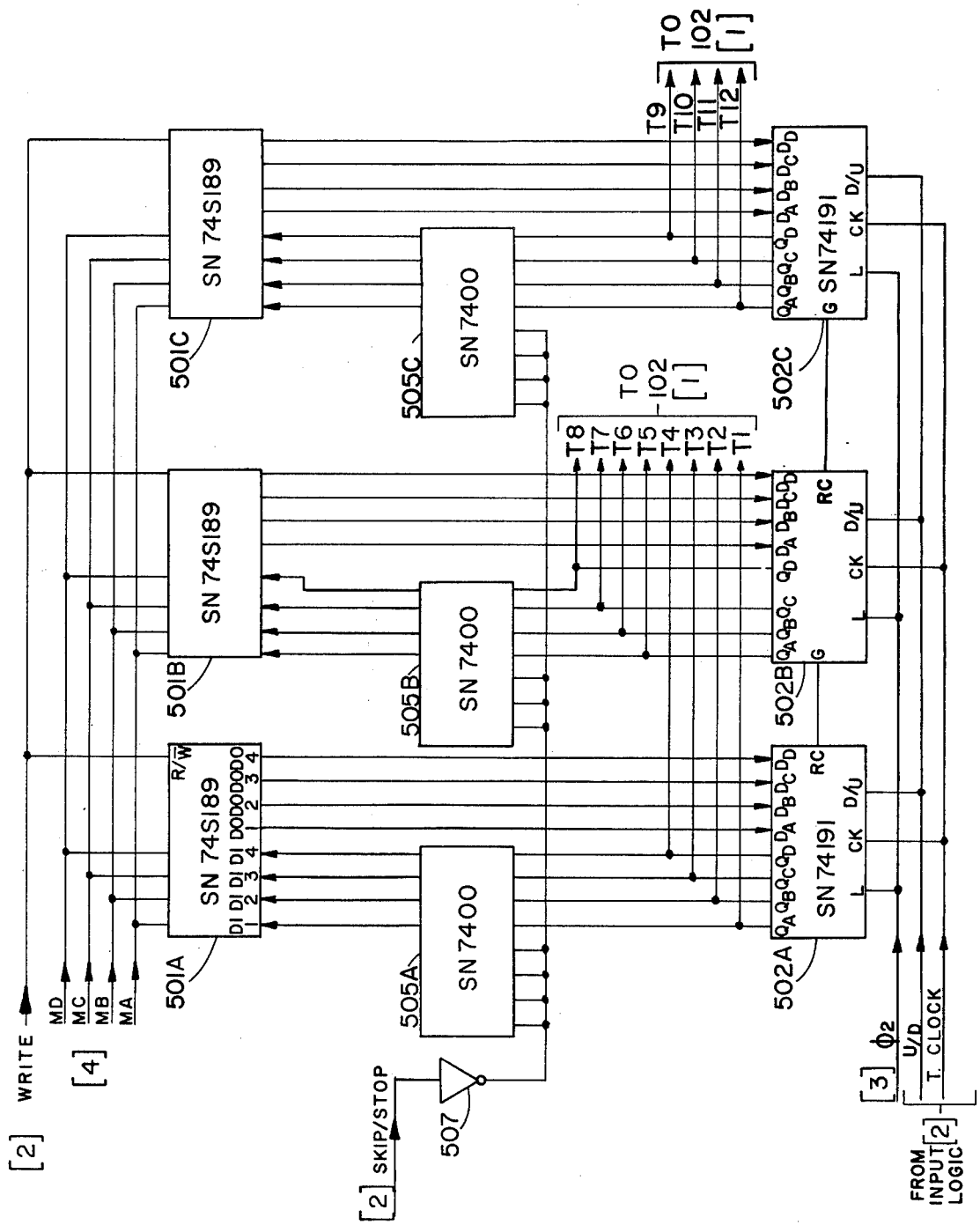
FIG. 5 is a schematic diagram of tuning apparatus 500 of FIG. 1.

The units and tens channel number memories are addressed at their $AD_A$–$AD_D$ terminals from the memory address counter leads M1-M4. The write line from the input logic in FIG. 2 is coupled to the R/$\overline{W}$ terminals of the memories. The channel counter clock signal and memory address clock signal are supplied to the address counter from the sequence control in FIG. 3. Since leads M1-M4 also extend to the tuning memories in FIG. 5, the address output of counter 401 accesses all of the memories simultaneously. A flip flop 406 is coupled to the memory address counter and is clocked along with it. The output of FF 406 constitutes the scan line for the memory status interrogator in FIG. 3. When the memory address counter has cycled once, FF 406 changes state and switches the logic level on the scan line from low to high as previously described.

The selective NOR gates 404U and 404T invert the logic levels on their input leads during transfer of information to the memories. Information is transferred from the counters to the memories during occurrence of a write signal when the skip/stop line is low. When the skip/stop line is high during occurrence of a write signal, the selective NOR gates are "forced" with a 1 logic level resulting in a 0 logic level being placed in the memory upon occurrence of a write pulse. These 0's in the channel number memory represent an empty memory location.

The memories also invert information logic levels between their inputs and outputs. Consequently, an empty location is read out as a series of 1's on the $DO_1$–$DO_4$ leads. These leads (from each of the memories 402U and 402T) are inputs to a NAND 407 which serves as an empty memory location detector. The output of this NAND supplies the empty location lead for the memory status interrogator in FIG. 3. It is also coupled to an indicator 408 which yields a visual indication of the system status, i.e. whether a skipped or programmed channel is being viewed.

TUNING APPARATUS (FIG. 5)

A trio of counters 502A, 502B and 502C are provided. A corresponding trio of memories 501A, 501B and 501C have their address inputs coupled to the appropriate memory address counter lines MA-MD. The write line from the input logic in FIG. 2 is coupled to the R/$\overline{W}$ terminals of the memories. The QA-QD outputs of the counters are coupled to a series of leads T1-T8 and T9-T12 which supply tuning voltage generator 102 in FIG. 1. The tuning voltage generator will be understood to include well-known apparatus for developing a tuning voltage for the receiver based upon the received information.

Information transfer between the counters and the memories requires "memory set" logic, included in blocks 505A, 505B and 505C. (These blocks include a plurality of NAND's.) An inverter 507 couples the skip/stop line to the first inputs of the blocks in the memory set logic. Their other inputs are connected to the outputs of the respective counters. The outputs of the blocks are connected to the "DI" inputs of the respective memories. All counter inputs are supplied with the $\phi_2$ signal at their load terminals and the up/down signal U/D at their D/U terminals. The D/U outputs of the memories are connected to the respective "D" inputs of the counters and the adjustment information will load during operation of the sequence control. The tuning clock signal, is supplied to their CK terminals.

Channels may be programmed for reception by operating the skipped channel switch until the channel counter produces the desired channel number in the channel number display area of the receiver (not shown). The receiver is then tuned by operating the tuning counters to receive the corresponding television signal associated with the channel number. Momentary movement of the skip/stop switch to the stop position sets the channel number and tuning information into the respective memories. Thereafter whenever the channel counter produces that channel number, the receiver will automatically tune to the associated channel signal. Channel numbers and tuning information may be deleted from the memories by momentarily moving the skip/stop to the skip position.

Tuning adjustments are "written" into the tuning memory as they are made when the receiver is receiving a programmed channel. Tuning adjustments may be made but are not entered into the tuning memory when receiving a non-programmed channel.

All labelled integrated circuit logic apparatus is available from Texas Instruments Corporation except for DM8130 which is available from National Semiconductor. The unused terminals of the apparatus are to be connected as follows:

|  | 0 Volts | 5 Volts |
|---|---|---|
| SN74190 |  | EG |
| SN74191 | $D_A D_B D_C D_D D/U$ | L, EG |
| SN74S189 | $\overline{CE}$ |  |
| DM8130 | A9,A10,B9,B10, S |  |

What has been described is a novel limited channel tuning system for a television receiver which may be set to tune to any television channel by sequencing of a channel counter control. Programmed channels are read out of memory in sequential order despite their actual order of programming and duplication of programmed channels is automatically avoided.

It is recognized that while particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. A television receiver tuning system including limited location channel number memory means for storing channel numbers and tuning information corresponding to desired television channels;
   address means coupled to said channel number memory means for addressing said limited locations;
   sequence control means operating said address means for initially scanning all locations of said memory means responsive to input of a channel number; and
   memory status interrogator means for subsequently accessing the locations of said memory means based upon the stored contents therein.

2. A tuning system as set forth in claim 1 further including a tuner and a tuning voltage generator; and
   read means for reading out the stored tuning information from the accessed location of said memory means for controlling said tuning voltage generator.

3. A tuning system as set forth in claim 2 wherein said address means comprises an address counter having an individual count for each location of said memory means; and
   wherein said sequence control means includes logic circuitry for causing said counter to sequentially scan said locations twice in succession for each channel number input.

4. A tuning system as set forth in claim 3 further including a comparator for generating an equality signal for said memory status interrogator means during scanning when the channel number input is equal to the channel number stored in any of said memory locations.

5. A tuning system as set forth in claim 4 wherein said system has a programmed channels mode and a skipped channels mode; and
   a skip/stop switch for writing tuning information into, or deleting tuning information from said memory locations.

6. A tuning system as set forth in claim 5 including;
   a channel number counter and an Up/Dn switch for controlling said channel number counter; and
   said sequence control means selectively operating said channel number counter and said address counter to step the address counter and scan the memory for each new channel number input.

7. A tuning system as set forth in claim 6 wherein empty locations in said memory are loaded with suitable information and including
   means decoding said information for yielding an empty location signal when said address counter addresses an empty memory location.

8. A tuning system as set forth in claim 7 wherein said address counter scans through said memory locations twice for each new channel number, the first scan for determining whether the channel number is stored in said memory and whether there are empty memory locations and the second scan for accessing the appropriate memory location.

9. A tuning system as set forth in claim 8 wherein during scanning of said memory for programmed channels, a continue signal is produced by said sequence control means after said first scan if the channel number is not in the memory.

10. A tuning system for a television receiver including a limited location channel number memory for storing tuning information corresponding to desired television signals comprising:
    a channel number counter;
    a memory address counter, initially scanning all said memory locations responsive to operation of said channel number counter;
    means for entering channel numbers and channel number-related tuning information in said memory locations;
    a tuning voltage generator;
    means for reading out said information for controlling said tuning voltage generator; and sequence means for controlling said memory address counter such that said memory locations are subsequently read out in channel number irrespective of the order of entry of said tuning information.

11. A tuning system as set forth in claim 10 further including tuning indicator means conveying to a viewer the channel number output of said channel number counter.

12. A tuning system as set forth in claim 11 wherein said sequence means controls said memory address counter to scan said memory locations twice for each generated channel number.

13. A tuning system as set forth in claim 12 further including memory status interrogator means determining on the first scan of said memory, (a) whether a memory location contains a channel number corresponding to the generated channel number, and
(b) whether there are empty locations in said memory; and said memory status interrogator means stopping said sequence means on the second scan in accordance with the above determinations.

14. A tuning system as set forth in claim 13 further including a skip/stop switch for programming or removing channel numbers and channel number-related information from said memory.

15. A tuning system as set forth in claim 14 further including a programmed channel switch and a skipped channel switch for stopping said sequence means for only programmed channels or for only skipped channels, respectively.

* * * * *